(12) United States Patent
Yang et al.

(10) Patent No.: US 9,997,574 B2
(45) Date of Patent: Jun. 12, 2018

(54) ORGANIC LIGHT-EMITTING DIODE DISPLAY HAVING A PLURALITY OF ELECTRODES FOR TOUCH RECOGNITION

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Shengji Yang, Beijing (CN); Xue Dong, Beijing (CN); Panhua Wang, Beijing (CN); Hailin Xue, Beijing (CN); Xiaochuan Chen, Beijing (CN); Haisheng Wang, Beijing (CN); Yingming Liu, Beijing (CN); Weijie Zhao, Beijing (CN)

(73) Assignees: BOE TECHNOLOGY GROUP CO., LTD., Beijing (CN); BEIJING BOE OPTOELEVTRONICS TECHNOLOGY CO., LTD., Beijing (CN)

( * ) Notice: Subject to any disclaimer, the term of this patent is extended or adjusted under 35 U.S.C. 154(b) by 0 days. days.

(21) Appl. No.: 15/500,595

(22) PCT Filed: May 20, 2016

(86) PCT No.: PCT/CN2016/082890
§ 371 (c)(1),
(2) Date: Jan. 31, 2017

(87) PCT Pub. No.: WO2017/024850
PCT Pub. Date: Feb. 16, 2017

(65) Prior Publication Data
US 2017/0221972 A1    Aug. 3, 2017

(30) Foreign Application Priority Data
Aug. 12, 2015  (CN) .......................... 2015 1 0493340

(51) Int. Cl.
*H01L 29/08* (2006.01)
*H01L 21/00* (2006.01)
(Continued)

(52) U.S. Cl.
CPC ........ *H01L 27/3227* (2013.01); *G06K 9/0004* (2013.01); *H01L 27/323* (2013.01);
(Continued)

(58) Field of Classification Search
CPC .............. H01L 27/3227; H01L 27/323; H01L 27/3234; H01L 51/5228; H01L 51/5203; G06K 9/0004
See application file for complete search history.

(56) References Cited

U.S. PATENT DOCUMENTS 8,283,851 B2 * 10/2012 Kim .................... H01L 27/3227
250/214 VT
8,624,849 B2 *  1/2014 Chang .................. G06F 3/0412
345/173
(Continued)

FOREIGN PATENT DOCUMENTS

CN         102209949 A      10/2011
CN         202351843 U       7/2012
(Continued)

OTHER PUBLICATIONS

The State Intellectual Property Office of the People's Republic of China (SIPO) Office Action 1 for 201510493340.7 dated Jun. 28, 2017 13 Pages (including translation).
(Continued)

*Primary Examiner* — Alonzo Chambliss
(74) *Attorney, Agent, or Firm* — Anova Law Group, PLLC (57) ABSTRACT

The present disclosure provides an organic light-emitting diode (OLED) display substrate. The OLED display sub-
(Continued)

strate includes a substrate and a plurality of organic light-emitting diode units. An organic light-emitting diode unit includes a first layer having an anode and a first electrode apart from the anode; an organic light-emitting layer; a cathode; and a second electrode insulated from the cathode. The anode and the cathode are configured to drive the organic light-emitting layer to emit light; and the first electrode and the second electrode are configured to recognize touch patterns.

12 Claims, 7 Drawing Sheets

(51) Int. Cl.
  *H01L 27/32* (2006.01)
  *H01L 51/52* (2006.01)
  *G06K 9/00* (2006.01)
(52) U.S. Cl.
  CPC ...... *H01L 27/3234* (2013.01); *H01L 51/5203* (2013.01); *H01L 51/5228* (2013.01)

(56) References Cited

U.S. PATENT DOCUMENTS

| | | | |
|---|---|---|---|
| 8,860,696 B2 | 10/2014 | Wassvik et al. | |
| 9,236,420 B2 * | 1/2016 | Lee | H01L 51/56 |
| 9,292,118 B2 * | 3/2016 | Lee | G06F 3/0412 |
| 9,761,816 B2 * | 9/2017 | Lee | H01L 51/56 |
| 2005/0063572 A1 | 3/2005 | Setlak et al. | |
| 2009/0141004 A1 * | 6/2009 | Yamazaki | G06F 3/0412 345/175 |
| 2011/0050604 A1 * | 3/2011 | Kwon | G06F 3/0412 345/173 |
| 2011/0109532 A1 | 5/2011 | Choi | |
| 2014/0145979 A1 * | 5/2014 | Lee | G06F 3/0412 345/173 |
| 2014/0353691 A1 * | 12/2014 | Lee | H01L 27/323 257/88 |
| 2015/0021627 A1 * | 1/2015 | Fujita | H01L 33/005 257/82 |
| 2015/0331508 A1 * | 11/2015 | Nho | G06F 3/0421 345/173 |
| 2016/0004353 A1 * | 1/2016 | Park | G06F 3/044 345/174 |

FOREIGN PATENT DOCUMENTS

| | | |
|---|---|---|
| CN | 102738199 A | 10/2012 |
| CN | 103842947 | 6/2014 |
| CN | 105047689 A | 11/2015 |

OTHER PUBLICATIONS

The World Intellectual Property Organization (WIPO) International Search Report for PCT/CN2016/082890 dated Sep. 1, 2016 p. 1-13.

* cited by examiner

ORGANIC LIGHT-EMITTING DIODE DISPLAY HAVING A PLURALITY OF ELECTRODES FOR TOUCH RECOGNITION

CROSS-REFERENCE TO RELATED APPLICATIONS

This PCT patent application is a national phase entry under 35 U.S.C. § 371 of International Application No. PCT/CN2016/082890, filed on May 20, 2016, which claims priority of Chinese Patent Application No, 201510493340.7 filed o Aug. 12, 2015. The above enumerated patent applications are incorporated by reference herein in their entirety.

TECHNICAL FIELD

The present invention generally relates to the display technologies and, more particularly, relates to an organic light-emitting diode (OLED) display substrate, a semiconductor device containing the OLED display substrate, and a related method for operating the OLED display substrate.

BACKGROUND

OLED display devices often have advantages such as high light-emitting efficiency and short responding time. OLED display devices are also flexible and actively emit light, requiring no backlight. Thus, OLED display devices have been widely used. As technology advances, more and more applications demand OLED display devices with fingerprint recognition functions to improve security and operability of the OLED display devices.

However, existing OLED display devices often have no fingerprint recognition functions, or require extra external fingerprint recognition components with complex structures for fingerprint recognition functions. That is, existing OLED display devices are not well integrated with fingerprint recognition technologies.

BRIEF SUMMARY

The present disclosure provides a display substrate and a related operating method. The display substrate may incorporate pattern recognition functions for the light-reflecting surface, such as fingerprint recognition, with display functions fairly well. The operating method may be used to implement the recognition functions on the light-reflecting surface when the OLED display substrate is displaying images.

One aspect of the present disclosure includes an organic light-emitting diode (OLED) display substrate. The OLED display substrate includes a substrate and a plurality of organic light-emitting diode units. An organic light-emitting diode unit includes a first layer comprising an anode and a first electrode apart from the anode; an organic light-emitting layer; a cathode; and a second electrode insulated from the cathode. The anode and the cathode are configured to drive the organic light-emitting layer to emit light; and the first electrode and the second electrode are configured to recognize touch patterns.

Optionally, the OLED display substrate further includes: a current-detecting terminal. The first electrode is connected to the current-detecting terminal.

Optionally, the first electrode layer and the second electrode are configured to form a photodiode; and the anode, the organic light-emitting layer, and the cathode are configured to form a pixel unit.

Optionally, the organic light-emitting unit further comprises an insulating layer, the insulating layer being between the second electrode and the cathode.

Optionally, the OLED display substrate further including a plurality of readout lines, a plurality of control lines, and a plurality of reading transistors. A reading transistor comprises a gate electrode; the readout lines are aligned along a first direction, a readout line being connected to a current-detecting terminal; the first electrodes are aligned along the first direction, a first electrode being connected to a readout line; and the control lines are aligned along a second direction perpendicular to the first direction, a control line being connected to gate electrodes of reading transistors along the second direction.

Optionally, a readout line is configured to transmit signals from a photodiode connected to the readout line through a current-detecting terminal; and a control line is configured to control states of connected reading transistors.

Optionally, a control line is configured to connect pixel unit aligned along the second direction for controlling scanning of pixel units and photodiodes in a same row.

Optionally, a pixel unit comprises a plurality of pixel transistors, the pixel transistors and the reading transistors being of a same type.

Another aspect of the present disclosure provides a semiconductor device. The semiconductor device includes the disclosed OLED display substrate.

Another aspect of the present disclosure provides an operating method for recognizing a light-reflecting surface structure using the disclosed OLED display substrate. The operating method includes displaying an image in the plurality of organic light-emitting units; detecting an electric current generated in an organic light-emitting diode unit; determining whether there is light reflected by the light-reflecting surface structure in each organic light-emitting diode unit; and determining a touch pattern of the light-reflecting surface structures.

Optionally, the detecting the electric current generated in an organic light-emitting diode unit further includes comparing electric currents generated by photodiodes in adjacent organic light-emitting diode units and determining whether an electric current is associated with light reflected by the light-reflecting surface structure; and determining organic light-emitting diode units corresponding to different parts of the touch pattern of the light-reflecting surface structure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

In the present disclosure, a light-reflecting surface structure possesses different optical characteristics at different parts of the surface. For illustrative purposes, the disclosure uses fingerprints as examples to illustrate the embodiments. The light-reflecting surface structure may also be a bar code, a two-dimensional code, or any other suitable objects or products capable of reflecting light with different intensities at different locations on the surface.

In addition, "recognition of patterns of light-reflecting surface structures" may refer to the process to recognize different optical characteristics at different parts/locations of the light-reflecting surface structure. For example, "recognition of patterns of light-reflecting surface structures" may be the recognition of the specific patterns of fingerprints, or the recognition of patterns of bar codes and two-dimensional codes.

Embodiments according to the present disclosure provides an OLED display substrate with fully integrated display and image recognition structures and functions. An OLED display substrate according to the present disclosure may include a plurality of pixel units. A cathode may be disposed on one side of the organic light-emitting layer, and an anode may be disposed on the other side of the organic light-emitting layer. The cathode, the anode, and the organic light-emitting layer in between may form an OLED or a pixel unit.

An OLED display substrate according to the present disclosure may include a plurality of image recognition units. In each image recognition unit, a first electrode may be disposed on one side of the organic light-emitting layer, and a second electrode may be disposed on the other side of the organic light-emitting layer. The first electrode, the second electrode, and the organic light-emitting layer in between may form a photodiode. The first electrode may be connected to a current-detecting terminal. The first electrode in one image recognition unit may be disconnected from first electrodes in other image recognition units.

An organic light-emitting diode (OLED) display substrate according to the present disclosure may include a substrate and a plurality of organic light-emitting diode units. The OLED unit includes a first layer with an anode and a first electrode apart from the anode; an organic light-emitting layer; and a cathode. The OLED unit also includes a second electrode insulated from the cathode. The anode and the cathode are configured to drive the organic light-emitting layer to emit light; and the first electrode and the second electrode are configured to recognize touch patterns. The first electrode layer and the second electrode are configured to form a photodiode. The anode, the organic light-emitting layer, and the cathode are configured to form a pixel unit.

An OLED display substrate according to the present disclosure may include a plurality of pixel units and image recognition units. In some embodiments, each image recognition unit is located next to a pixel unit. When the OLED display substrate is displaying images, the pixel units may emit light. When a fingertip or another object is touching or approaching the OLED display panel containing the OLED display substrate, e.g., pressing or touching the packaging substrate, light emitted by the pixel units may be reflected back to image recognition units near or at the touch location. Because the valleys and ridges have different light-reflecting characteristics, light illuminated on image recognition units by reflection from the valleys and the ridges of the fingertip may have different intensities. The current generated by the photodiodes of image recognition units corresponding to the valleys and the ridges may thus be different.

By analyzing the electric current generated by each image recognition unit, the image recognition units corresponding to the valleys and the image recognition units corresponding to the ridges can be identified. That is, image recognition units at different locations corresponding to the valleys and the ridges may be identified. The pattern of the fingerprint of the fingertip can be determined.

Figure 1:
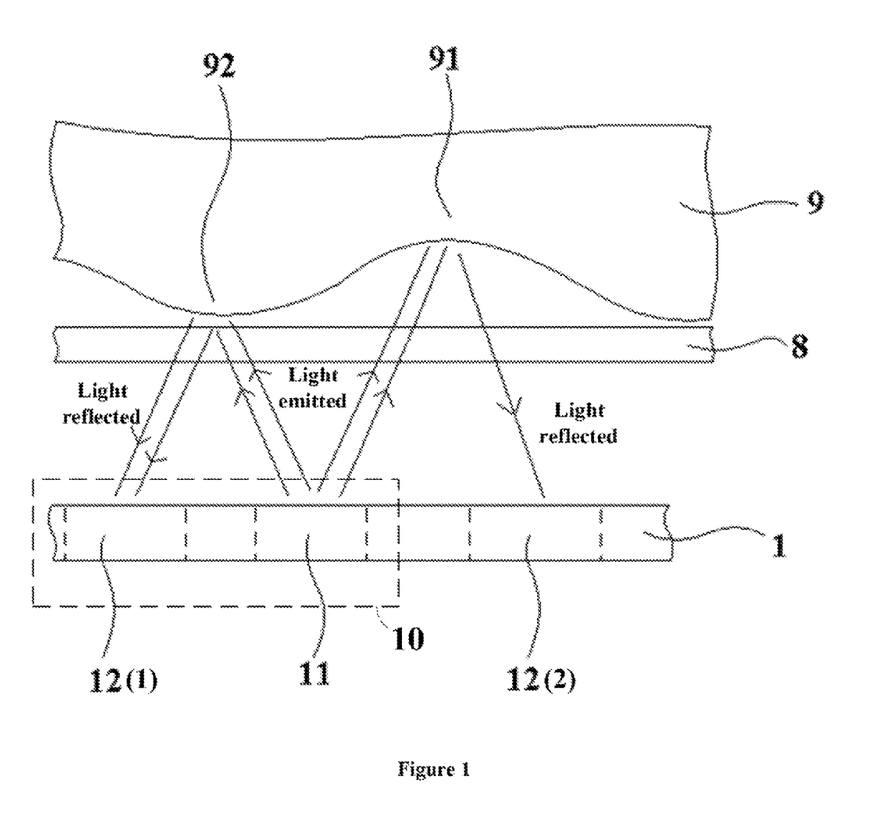
FIG. 1 illustrates the working principle of an exemplary OLED display substrate according to the embodiments of the present disclosure.
Figure 2:
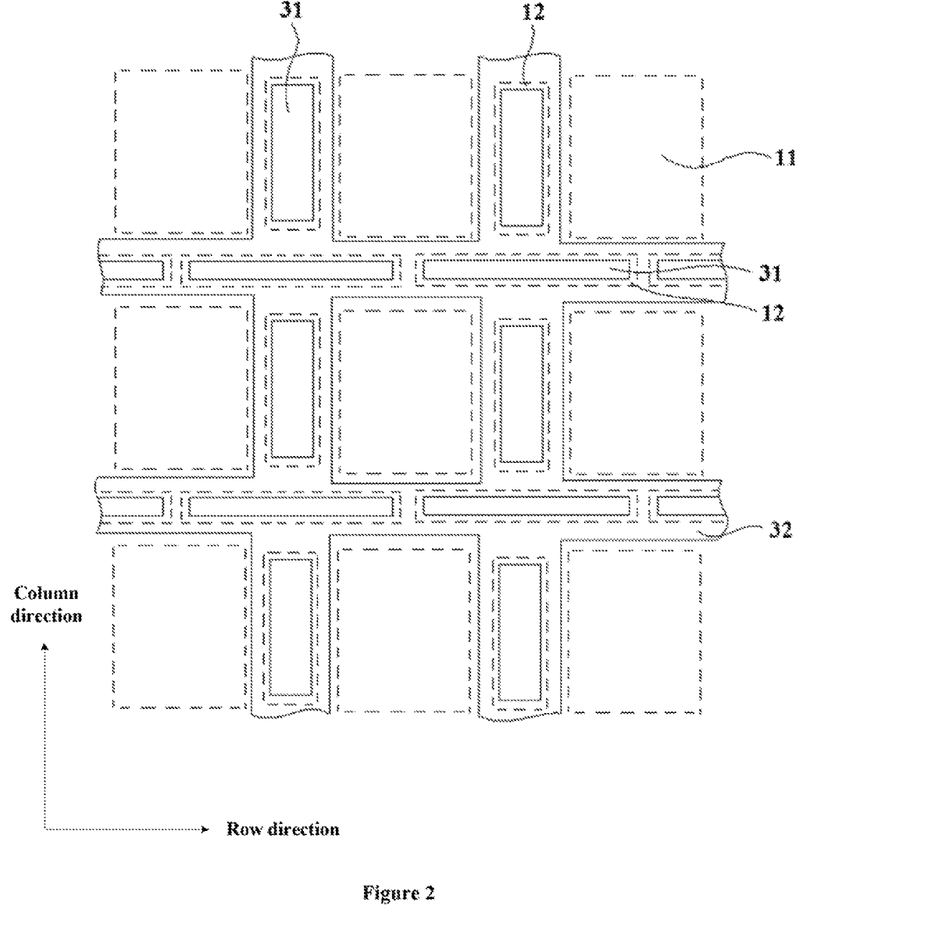
FIG. 2 illustrates a top view of a portion of an exemplary OLED display substrate according to the embodiments of the present disclosure.
Figure 3:
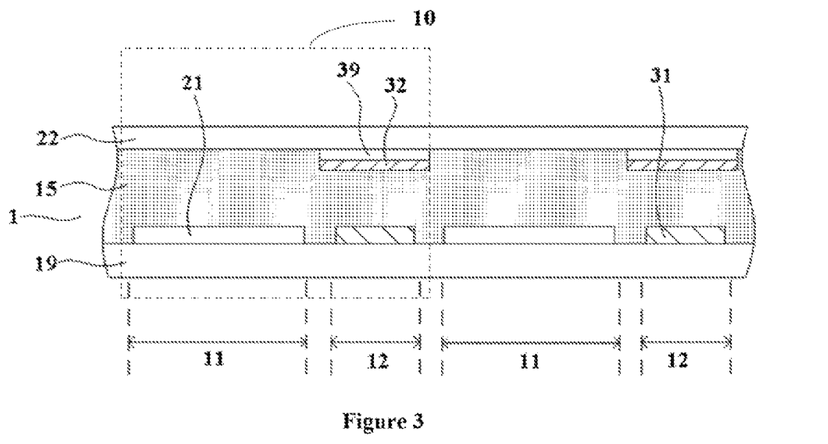
FIG. 3 illustrates a cross-sectional view of a portion of an exemplary OLED display substrate according to the embodiments of the present disclosure.
Figure 4:
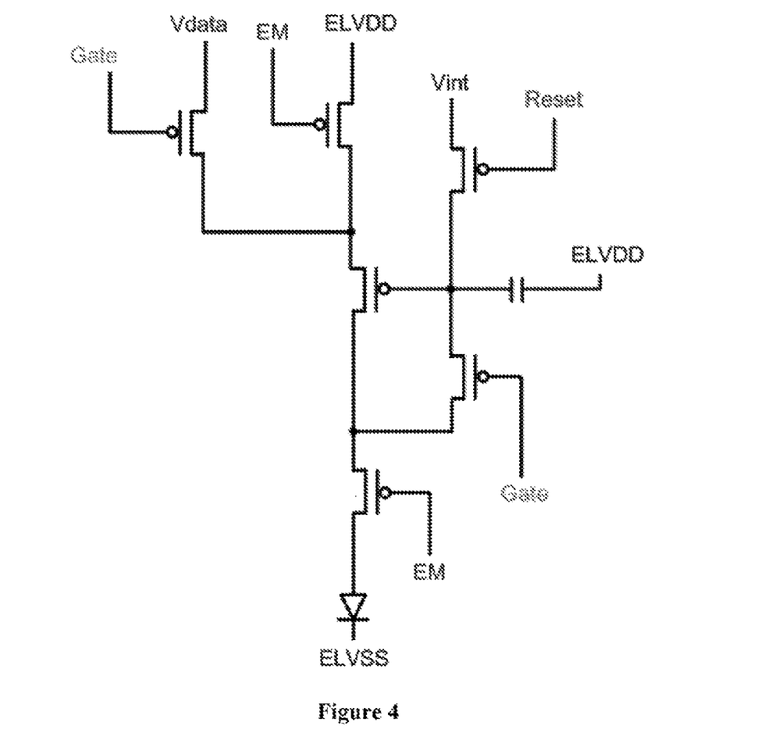
FIG. 4 illustrates an exemplary pixel circuit used in an OLED display substrate according to the embodiments of the present disclosure.
Figure 5:
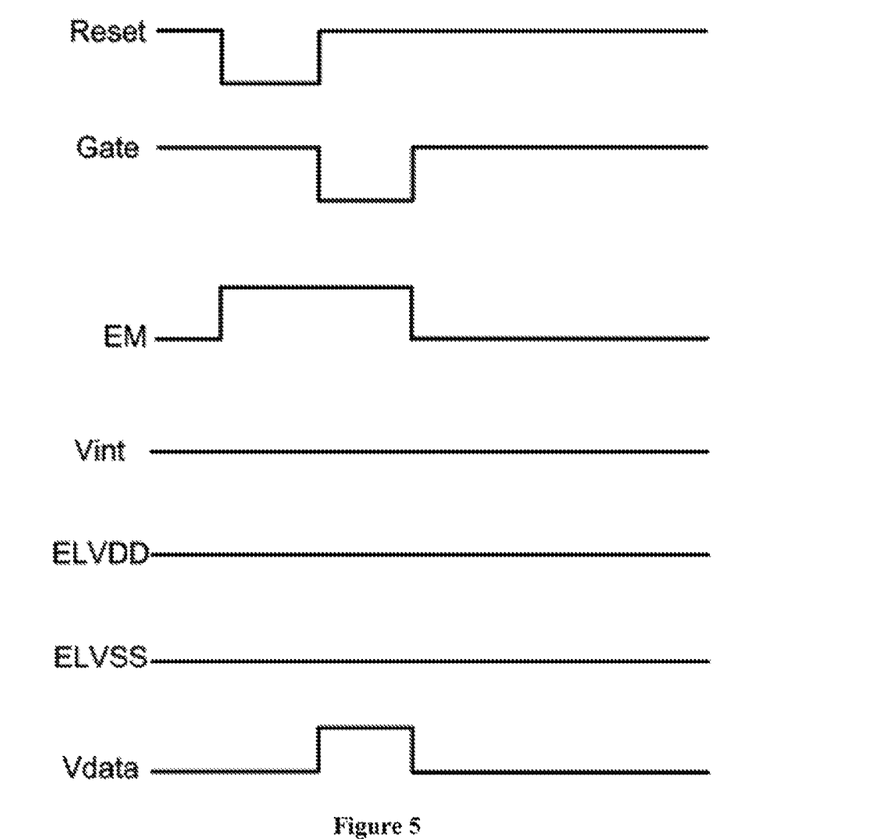
FIG. 5 illustrates an exemplary control timing diagram for the pixel circuit illustrated in FIG. 4.
Figure 6:
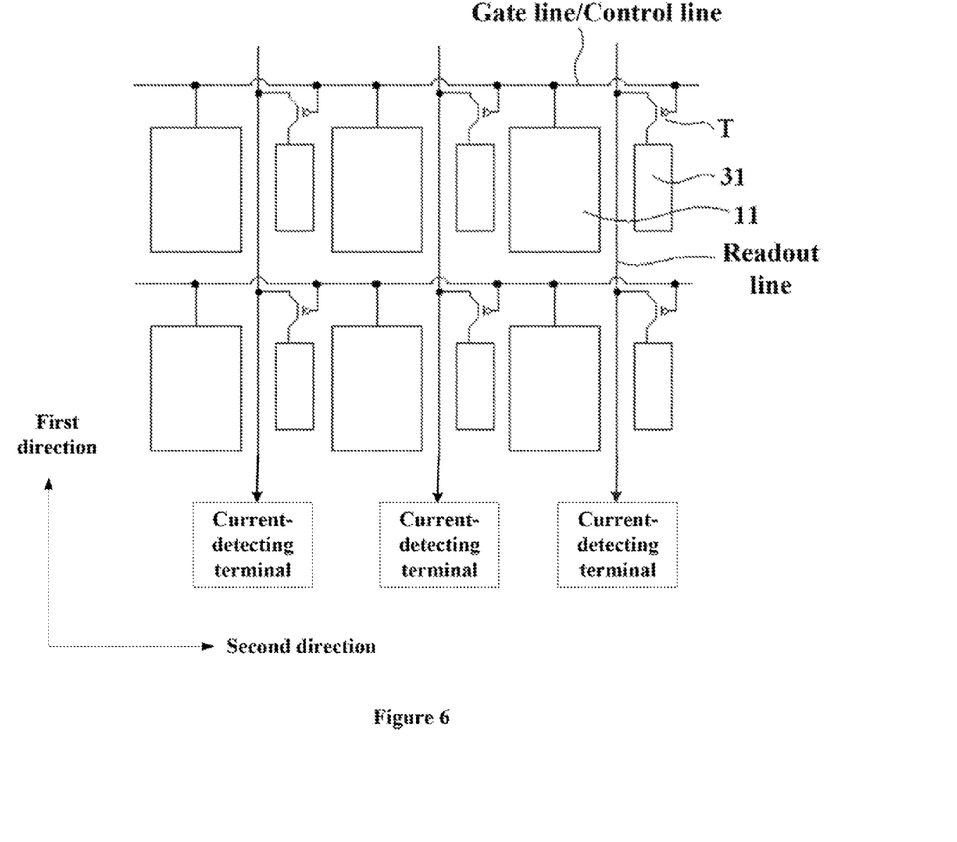
FIG. 6 illustrates an exemplary configuration of an OLED display substrate according to the embodiments of the present disclosure.
Figure 7:
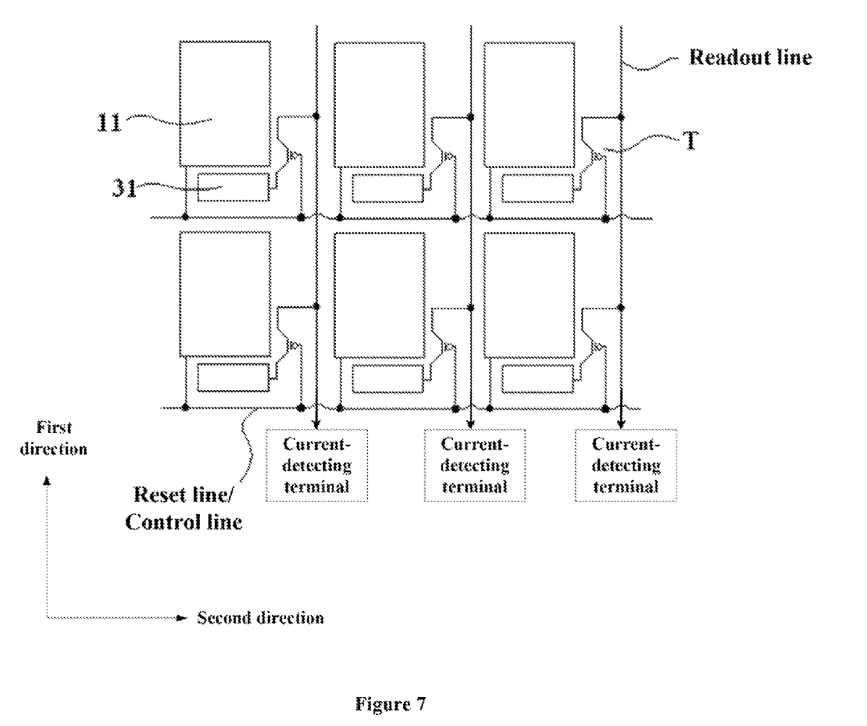
FIG. 7 illustrates another exemplary configuration of an OLED display substrate according to the embodiments of the present disclosure.
Figure 8:
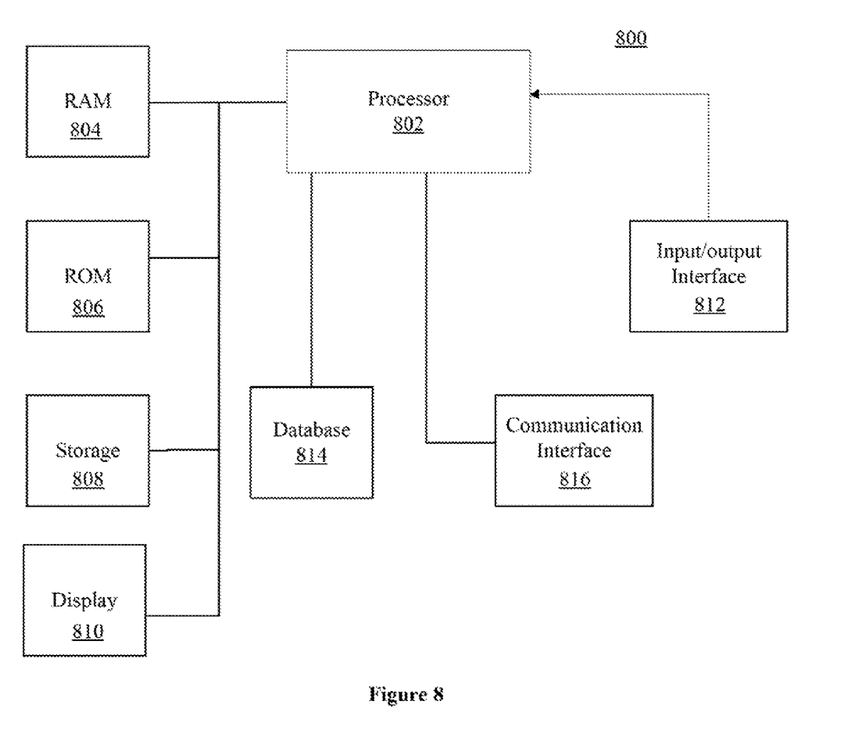
FIG. 8 illustrates a block diagram of a current-detecting terminal used in an OLED display substrate according to the embodiments of the present disclosure.

One aspect of the present disclosure provides an OLED display panel. FIGS. 1-8 illustrate various aspects of an OLED display substrate 1 according to embodiments of the present disclosure. The OLED display substrate 1 may include an organic light-emitting layer. Specifically, FIG. 1 illustrates an exemplary OLED display substrate. FIGS. 2 and 3 illustrate a top view and a cross-sectional view of a portion of an exemplary OLED display. FIG. 4 illustrates an exemplary pixel circuit used in an OLED display substrate. FIG. 5 illustrates an exemplary control timing diagram for the pixel circuit of FIG. 4. FIGS. 6 and 7 illustrate two exemplary configurations of an OLED display substrate. FIG. 8 illustrates a block diagram of a current-detecting terminal used in an OLED display substrate.

First, a cross-sectional view of the OLED display substrate 1 is shown in FIG. 3. As shown in FIG. 3, the disclosed OLED display substrate 1 may include a substrate 19 and an organic light-emitting layer 15 on the substrate 19. To simplify the fabrication process of the OLED display substrate 1, the organic light-emitting layer 15 may fully cover the substrate 19. That is, the organic light-emitting layer 15 may be disposed at a plurality of locations on the substrate 19.

Further, as shown in FIG. 3, the disclosed OLED display substrate 1 may include a plurality of pixel units 11. A cathode 22 may be disposed on one side of the organic light-emitting layer 15, and an anode 21 may be disposed on the other side of the organic light-emitting layer 15. The cathode 22, an anode 21, and the organic light-emitting layer 15 in between may limn an OLED or a pixel unit 11. The cathode 22 and the anode 21 may drive the organic light-emitting layer 15 to emit light for displaying images. That is, the disclosed OLED display substrate 1 may include a plurality of OLEDs formed by the cathode 22, the organic light-emitting layer 15, and the anodes 21.

Further, as shown in FIG. 3, the disclosed OLEO display substrate 1 may also include a plurality of image recognition units 12 for recognizing touch patterns of light-reflecting surface structures. In the present disclosure, fingerprints are used as examples to illustrate the embodiments. In an image recognition unit 12, the cathode 22 and the anode 21 may each be disposed on a different side of the organic light-emitting layer 15 to form an OLED. A first electrode 31 may be disposed on one side of the organic light-emitting layer 15, and a second electrode 32 may be disposed on the other side of the organic light-emitting layer 15. The first electrode 31, the second electrode 32, and the organic light-emitting layer 15 in between may form a photodiode. The first electrode 31 may be connected to a current-detecting terminal. The first electrode 31 in one image recognition unit 12 may be disconnected from the first electrodes 31 in other image recognition units 12.

That is, as shown in FIG. 2, the disclosed OLED display substrate 1 may include a plurality of pixel units 11 for displaying images, and a plurality of image recognition units 12 for recognizing fingerprints. A pixel unit 11 may correspond to a smallest light-emitting unit in the disclosed OLED display substrate 1. The pixel units 11 may be arranged in an array. Space between adjacent pixel units 11 may be used for disposing conductive lines and may not be used for displaying images. The image recognition units 12 may be disposed in the space not for displaying images. A pixel unit 11 and an adjacent image recognition unit 12 may form an organic light-emitting diode (OLED) unit. Accordingly, the disclosed OLED display substrate 1 may include a plurality of OLED units. The dashed squares in FIGS. 1 and 3 each illustrates an exemplary OLED unit 10. An OLED unit 10 may be capable of emitting light for displaying images and recognizing touch patterns.

The organic light-emitting layer 15 may include an electron transport layer (ETL), an electron injection layer (EIL), an emissive material layer (EML), a hole injection layer (HIL), and a hole transport layer (HTL). The organic light-emitting layer 15 may be a PN junction. In a pixel unit 11, the cathode 22 and the anode 21 may be disposed on the two sides of the organic light-emitting layer 15. The PN junction may be forward biased by the cathode 22 and the anode 21 to form an OLED or a pixel unit 11. The OLED may emit light for displaying images. In an image recognition unit 12, the first electrode 31 and the second electrode 32 may be disposed on the two sides of the organic light-emitting layer 15. The PN junction may be reversely biased by the first electrode 31 and the second electrode 32 in the image recognition unit 12 so that a photodiode may be formed between the first electrode 31 and the second electrode 32. The photodiode may generate electric current when illuminated with light. That is, a pixel unit 11 and an image recognition unit 12 may be formed in an OLED unit 10. Electric current may be generated in an OLED unit 10 for implementing touch pattern recognition functions. In one embodiment, the polarity of the first electrode 31 may be opposite of the anode 21 and the polarity of the second electrode 32 may be opposite of the cathode 31. To detect the electric current in each photodiode, a first electrode 31 may be connected to a current-detecting terminal. To avoid crosstalk of electric current in the first electrodes 31, each first electrode 31 may be separated from other first electrodes 31.

In the present disclosure, "the first electrode 31" and "the second electrode 32" are only for illustrative purposes, e.g., for illustrating the connection with the current-detecting terminal. The "first electrode 31" and "the second electrode 32" do not indicate any order or relationship in voltages or positions. It is only required the two electrodes can form a photodiode with the organic light-emitting layer 15. That is, the electrode connected to the current-detecting terminal may be the first electrode 31, and the other electrode may be the second electrode 32. The terms "the first electrode 31" and "the second electrode 32" do not indicate the first electrode 31 needs to be located on a particular side of the organic light-emitting layer 15, nor do they indicate the voltage applied by the first electrode 31 is higher or lower than the voltage applied by the second electrode 32.

Referring to FIG. 1, when the OLED display substrate 1 is displaying images, the pixel units 11 may emit light. When a fingertip 9 is touching or approaching the OLED display panel containing the OLED display substrate 1, e.g., pressing or touching the packaging substrate 8, light emitted by the pixel units 11 may be reflected back to image recognition units 12 near or at the touch location. Because the valleys 91 and ridges 92 have different light-reflecting characteristics, light illuminated on image recognition units 12 by reflection from the valleys 91 and the ridges 92 of the fingertip 9 may have different intensities. The current generated by the photodiodes of image recognition units 12 corresponding to the valleys 91 and the ridges 92 may thus be different. By analyzing the electric current generated by each recognition region 12 or each OLED unit 10, the image recognition units 12 corresponding to the valleys 91 and the image recognition units 12 corresponding to the ridges 92 can be identified. That is, image recognition units 12, of different OLED units 10 and at different locations corresponding to the valleys 91 and the ridges 92, may be identified. The touch pattern of the fingerprint of the fingertip 9 can be determined.

The structure of the OLED display substrate 1 may determine the object or light-reflecting surface structure that can be recognized by the image recognition units 12. For example, the sizes of the image recognition units 12 and the OLEO units 10, the distribution density of the image recognition units 12, and the distribution locations of the image recognition units 12 may need to be designed to correspond to the object for the recognition process. For example, an image recognition unit 12 designed for fingerprint recognition functions may be much smaller than an image recognition unit 12 designed for two-dimensional code recognition. The distribution of the image recognition units 12 designed for fingerprint recognition ma also be much denser than the image recognition units 12 designed for two-dimensional code recognition. The working principles of the image recognition units 12 for various light-reflecting surface structures may be similar or the same, and are not repeated herein.

Because the organic light-emitting layer 15 is a required part for displaying images, compared to an existing OLED display substrate, the structure of the disclosed OLED display substrate 1 does not require significant changes. The image recognition units 12 and the pixel units 11 may be integrated together, as shown in FIGS. 1 and 3, to implement recognition of touch patterns of light-reflecting surface structures, e.g., patterns of fingerprints, and OLEO display functions.

In some embodiments, the first electrodes 31 and the anodes 21 may be disposed in the same layer and disconnected or apart from each other.

Referring back to FIG. 3, in some embodiments, the first electrodes 31 and the anodes 21 may be formed from a same material layer and made of a same material. The first electrodes 31 and the anodes 21 may be in the same layer and can be formed through one patterning process, e.g., a photolithography and a follow-up etch. The fabrication process of the OLED display substrate 1 may be simplified. The top surface of a first electrode 31 and the top surface of an anode 21 may have the same distance or different distances to the substrate 19.

The reason the first electrodes 31 are disposed in a same layer as the anodes 21, instead of the cathode 22, may include that, often, the anodes 21 of the pixel units 11 are separated and the cathode 22 of the pixel units 11 are connected. Thus, it may be more convenient to dispose the first electrodes 31 in the space between adjacent anodes 21. If the first electrodes 31 are disposed in a same layer with the cathode 22, the structure of the cathode 22 may need to be changed accordingly to make space for the first electrodes 31. The fabrication process may be less convenient.

In some embodiments, the second electrodes 32 may be disposed on the side of the organic light-emitting layer 15 that is closer to the cathode 22. The layer a second electrode 32 is disposed is closer to the organic light-emitting layer 15 than the cathode 22. As shown in FIG. 3, an insulating layer 39 may be disposed between a second electrode 32 and the cathode 22.

In some embodiments, because the first electrodes 31 and the anodes 21 are disposed in the same layer, the second electrodes 32 may be disposed on the same side with the cathode 22. In this case, the voltage provided by the second electrodes 32 may be higher than the voltage provided by the first electrodes 31. Often, the cathode 22 is a whole piece, so that the second electrodes 32 may not be disposed in the same layer as the cathode 22. Thus, in some embodiments, the second electrodes 32 may be disposed between the cathode 22 and the organic light-emitting layer 15. Also, an insulating layer 39 may be used to insulate a second electrode 32 from the cathode 22. The insulating layer 39 may be disposed between a second electrode 32 and the cathode 22.

It should be noted that, the configuration described above is only exemplary. The actual arrangement of the electrodes may be subjected to different applications and should not be limited by the embodiments of the present disclosure. For example, the first electrodes 31 may be disposed on the side of the organic light-emitting layer 15 that is close to the cathode 22, and the second electrodes 32 may be disposed on the side of the organic light-emitting layer 15 that is close to the anodes 21. In this case, the voltage provided by the first electrodes 31 may be higher than the voltage provided by the second electrodes 32. In another example, the first electrodes 31 and the anodes 21 may be disposed in different layers, e.g., the first electrodes 31 may be disposed in a separate layer from the anodes 21. In another example, the second electrodes 32 and the cathode 22 may be disposed in a same layer and the second electrodes 32 may be disconnected from the cathode 22. In another example, the second electrodes 32 and the cathode 22 may be disposed in a same layer and the second electrodes 32 may be connected with the cathode 22. In this case, the voltage provided by the first electrodes 31 may be lower than the voltage provided by the cathode 22, which may be difficult to implement. Thus, the configuration of the first electrodes 31 and the second electrodes 32 may vary according to different applications and the specific arrangements are not described in detail. It is only required that a first electrode 31 and a second electrode 32 may form an OLED, and each first electrode 31, separated from other first electrodes 31, is connected to a current-detecting terminal.

In some embodiments, an image recognition unit 12 may be disposed between each two adjacent pixel units 11.

The number or distribution density of the image recognition units 12 may be related to the resolution or precision of fingerprint recognition. Thus, as shown in FIG. 2, in some embodiments, an image recognition unit 12 may be disposed in the space between each two adjacent pixel units 11. That is, image recognition units 12 may be disposed along the row/horizontal direction and the column/vertical direction to obtain highest or maximum resolution. In some other embodiments, a plurality of pixel units 11 may be disposed between two closest image recognition units 12.

In some embodiments, the second electrodes 32 in at least some of the image recognition units 12 may be connected.

As described above, electric current may flow out through the first electrodes 31, such that it may only be required that each first electrodes 31 is separated from each other. The second electrodes 32 may only be required to provide a uniformed voltage to the image recognition units 12. Thus, the second electrodes 32 in a plurality of image recognition units 12 or OLED units 10 may be connected together as a whole piece. In this case, the resistance of the connected second electrodes 32 may be lower, and one conductive line may be used to provide electric current to a plurality of image recognition units 12 or OLED units 10. Specifically, as shown in FIG. 2, the second electrodes 32 may be disposed in the space between each two adjacent pixel units 11 to form a net-like configuration. Alternatively, the configuration of the second electrodes 32 may also be viewed as a plate with "openings" at the pixel units 11.

In some embodiments, as shown in FIG. 6, the disclosed OLED display substrate 1 may further include a plurality of readout lines Read arranged along a first direction. Each readout line Read may be connected to a current-detecting terminal. First electrodes of plurality of image recognition units 12 aligned along the first direction may be connected to a readout line Read through a reading transistor T. The disclosed OLED display substrate 1 may further include a plurality of control lines Control arranged along a second direction. Each control line Control may be connected to the gate electrodes of the reading transistor T contained in a plurality of image recognition units 12 aligned along the second direction. The second direction may be perpendicular to the first direction. In one embodiment, the first direction is the column direction, and the second direction is the row direction.

The disclosed OLED display substrate 1 may include a plurality of image recognition units 12. If the first electrode 31 of each image recognition unit 12 is connected to a separate current-detecting terminal through a separate conductive line, the structure of the disclosed OLED display substrate 1 may be undesirably complex. Thus, as shown in FIGS. 6 and 7, the first electrodes of a plurality of image recognition units 12 aligned in a column may be connected to a same readout line Read through a corresponding reading transistor T. The readout line Read may be connected to a current-detecting terminal. The gate electrode of each reading transistor T that is connected to the image recognition unit 12 aligned in a same row may be connected to a same control line Control. In this case, the reading transistors T connected to the same control line Control may each be connected to a different readout line Read. Thus, when a control line Control inputs a turn-on signal to the reading transistors T, the reading transistors T connected to the control line Control may be turned on. That is, only one reading transistor 'T', among the plurality of reading transistors T, connected to each readout line Read, may be turned on. Electric current generated by the image recognition unit 12 corresponding to the turned-on reading transistor T may flow into the current-detecting terminal. Thus, by inputting the turn-on signals to each control line Control according to a certain timing, e.g., a scanning sequence, the current from each image recognition unit 12 or each OLED unit 10 may be read out sequentially for touch pattern recognition functions. In other words, the image recognition units 12 may also be controlled by a suitable scanning sequence, e.g., a scanning sequence similar to the scanning of the pixel units 11.

In one embodiment, the reading transistors T may be P-type thin-film transistors (TFTs), and the turn-on signal may be a low potential signal. In other various embodiments, the reading transistors T may also be other types of transistors, and the turn-on signals should be determined according to the types of transistors. In one embodiment, the first direction is the column direction and the second direction is the row direction.

In the present disclosure, the embodiments are described using the first direction as the column direction, and the second direction as the row direction. In certain other embodiments, the readout lines Read may also be aligned along the row direction and may repeat along the column direction; and the control lines Control may also be aligned along the Column direction and may repeat along the row direction. That is, the first direction may be the row direction and the second direction may be the column direction. In this case, the line connections and working principles of the OLED display substrate 1 may be the same as the OLED display substrate 1 described previously and are not repeated herein.

In some embodiments, a control line Control may be connected to the pixel circuits of a plurality of pixel units 11 aligned along the second direction.

To drive the OLED in a pixel unit 11 to emit light, each pixel unit 11 may include a pixel circuit. For example, a pixel circuit used in the pixel unit 11 is shown in FIG. 4, and a timing diagram of the control signals used to drive/control the pixel circuit is shown in FIG. 5. The pixel circuit shown in FIG. 4 may include six thin-film transistors (TFTs, T1-T6) and one capacitor (C). The six TFTs may also be referred as the pixel transistors. T1, T2, T4, T5, and T6 may be switching TFTs, and T3 may be the driving TFT. C may be a storing capacitor. The gate line Gate, the reset line Reset, and the control terminal EM may provide scanning signals to control the on/off states of the TFTs. The pixel circuit with a configuration shown in FIG. 4 may prevent drift of the threshold voltages ($V_{th}$) of the TFTs. The display performance of the OLED display substrate 1 may be improved. Other suitable pixel circuits may also be used to drive a pixel unit 11 in the disclosed embodiments. The working principles of the pixel circuits are not described in detail.

As shown in FIGS. 4 and 5, the pixel circuit may be controlled through certain conductive lines and terminals. For example, the pixel circuit may be controlled through a first reference voltage terminal ELVDD, a second reference voltage terminal ELVSS, a data line Vdata, an initial terminal Vint, the control terminal EM, the gate line Gate, and the reset line Reset. At least some of the conductive lines and terminals are disposed along the row direction and are connected to pixel circuits in one row. Among these conductive lines and terminals, some are used to input periodic signals or periodic turn-on signals to the pixel transistors. Thus, the conductive lines and terminals aligned along the row direction and connected to pixel circuits in rows may be used as the control line Control described above, to simultaneously control the pixel circuits in a row and the reading transistors T in the same row. In other words, these conductive lines and terminals may share the same signals with the control lines Control. The structure of the disclosed OLED display panel may be simplified.

For example, in the pixel circuit shown in FIG. 4, the gate line Gate and the reset line Reset may input periodic signals to the pixel circuit. Thus, the gate line Gate or the reset line Reset may be connected to the gate electrodes of the reading transistors T in the same row so that the gate line Gate or the reset line Reset may be used as the control line Control of the same row. That is, according to the arrangement described above, two control lines Control may be disposed between two rows of pixel units 11, and the two control lines Control may be used to control reading transistors T corresponding to different image recognition units 12. For example, as shown in FIG. 6, the gate line Gate may be used to control the reading transistors T of each image recognition unit 12 in one row, where an image recognition unit 12 may be disposed between each two adjacent pixel units 11 in the same row. Meanwhile, as shown in FIG. 7, the reset line Reset may be used to control the reading transistors T of each image recognition unit 12 in one row, where one image recognition unit 12 may be adjacent to another image recognition unit 12 in the same row. In a period, the gate line Gate and the readout line Read may each input a turn-on signal to both the pixel circuits and the reading transistors T in the same row. That is, a control line Control may be used to control the scanning of pixel units and the image recognition units simultaneously.

It should be noted that, FIGS. 6 and 7 are only exemplary to illustrate the connections of the conductive lines to different parts/regions. The actual physical structure of the disclosed OLED display substrate are not shown in FIGS. 6 and 7. Only conductive lines, terminals, and related structures are shown for illustrative purposes.

In some embodiments, a pixel unit 11 may include a plurality of pixel transistors. The pixel transistors and the reading transistors may be a same type of transistors. For example, the pixel transistors and the reading transistors may be P-type transistors. The active regions of the pixel transistors and the reading transistors may be fabricated in a same fabrication step. The fabrication process of the disclosed OLED display substrate may be more convenient.

It should be noted that, the arrangement described above are only exemplary. In certain embodiments, the pixel transistors and the reading transistors may also be different types of transistors, and the pixel transistors may also include different types of transistors. The types of transistors may be determined by factors such as the actual configuration of the pixel circuit, the control signals, and the sharing of control lines Control.

Another aspect of the present disclosure may provide an operating method for recognizing patterns of light-reflecting surface structures using the disclosed OLED display substrate 1. In the disclosure, fingerprints are used as examples for light-reflecting surface structures.

The operating method may include, when the disclosed OLED display substrate is displaying images, analyzing signals/electric current generated by the photodiode in each image recognition unit 12 or each OLED unit 10 caused by the light reflected by light-reflecting surface structures, e.g., a fingertip 9 in FIG. 1, to obtain the touch pattern of the light-reflecting surface structure, e.g. a fingerprint.

That is, as shown in FIG. 1, when the disclosed OLEO display substrate 1 is displaying images, each pixel unit 11 may emit light. When a fingertip 9 (e.g., the light-reflecting surface structure) is approaching or touching the OLED display substrate 1, light emitted by the pixel units 11 may be reflected back by the fingertip 9. The reflected light may reach the image recognition units 12 at and near the touch location so that the photodiode in the image recognition units 12 may generate electric current. Because the reflective characteristics of the ridges 92 and the reflective characteristics valleys 91 are different, the light intensity illuminated on the photodiodes corresponding to a ridge 92, e.g., image recognition unit 12(1) in FIG. 1, may be different from the light intensity illuminated on the photodiodes corresponding to a valley 91, e.g., image recognition unit 12(2) in FIG. 1. That is, the electric current generated by the image recognition units 12 corresponding to a ridge 92, e.g., image recognition unit 12(1) in FIG. 1, may be different from the electric current generated by the image recognition units 12 corresponding to a valley 91, e.g., image recognition unit 12(2) in FIG. 1. Thus, by analyzing the signals generated by each image recognition unit 12 or each OLED unit 10, the image recognition units 12 corresponding to the ridges 92 and the valleys 91 may be determined. The pattern of the fingerprint of the fingertip 9 may be obtained and the fingerprint recognition process may be completed.

Because light illuminated by the outside environment often has a sufficiently higher intensity than the light intensity reflected by the light-reflecting surface structure and a considerably uniformed distribution the signals generated by the image recognition units 12 or OLED units 10 corresponding to the light illuminated by the outside environment and by the image recognition units 12 or OLED units 10 corresponding to the reflected light would at least have recognizable difference in intensities. Thus, the pattern of the light-reflecting surface structure can be detected.

In some embodiments, a process to determine or recognize the signals generated by the photodiodes in the image recognition units 12, illuminated by the light reflected by the light-reflecting surface structure, may include comparing electric current of each image recognition unit 12 and determining the electric current generated by photodiodes that receive light reflected by the light-reflecting surface structure, e.g., the fingertip 9 in FIG. 1. The image recognition units 12 corresponding to the ridges 92 and the valleys 91 may be determined.

That is, in some embodiments, a suitable comparison process, e.g., a difference method, between signals generated by adjacent image recognition units 12 or adjacent OLED units 10 may be used to determine if an image recognition unit 12 corresponds to a valley 91 of the fingerprint or a ridge 92 of a fingerprint. The reason for performing a suitable comparison process is described as follows. Although light reflected by the ridges 92 and the valleys 91 may have different intensities, the intensities of the reflected light may be largely dependent on the light illuminated on the fingertip 9. When each pixel unit 11 illuminates light of a different intensity, it may be difficult to determine the fingerprint pattern based on the absolute value of signal generated by each image recognition unit 12. Also, because neighboring image recognition units 12 may be located sufficiently close to each other, light intensities generated by neighboring pixel units 11 may be close or substantially the same. Thus, the difference in signals generated by neighboring image recognition units 12 may be considered to be caused only by different features or different light-reflecting characteristics on the fingerprint. Thus, it may be easier to determine the fingerprint pattern based on the difference in light intensities generated by neighboring image recognition units 12.

Other suitable methods may also be used to determine fingerprint pattern. For example, the light intensity emitted by each pixel unit 11 may be calculated in advance before displaying images. Further, when a fingertip 9 is approaching or touching the disclosed OLED display substrate 1, the disclosed OLED display substrate 1 may calculate die absolute values of the electric current generated by the image recognition units 12 corresponding to the valleys 91 and corresponding to the ridges 92 of the fingertip 9, respectively. The calculated absolute values of signals may be used to recognize the fingerprint pattern.

Another aspect of the present disclosure provides a semiconductor device. The semiconductor device may include one or more of the disclosed OLED display array substrates. In some embodiments, the semiconductor device, may be a display apparatus.

That is, the one or more OLED display substrates may be integrated with packaging substrates, a power supply, a shell, and other related parts to form a semiconductor device, which provides integrated display and image recognition functions.

In the semiconductor device, the current-detecting terminals may contain suitable software and hardware for configuring images such as fingerprint patterns. For illustrative purposes, each readout line may be connected to a different current-detecting terminal. In practice, the current-detecting terminals may be separated or integrated together as one or more terminals. The specific arrangement of the current-detecting terminals should be determined according to different applications and should not be limited by the embodiments of the present disclosure. FIG. 8 illustrates a block diagram of the current-detecting terminals used in the present disclosure.

The current-detecting terminals may receive, process, and execute commands from the semiconductor device. The current-detecting terminals may include any appropriately configured computer system. As shown in FIG. 8, the current-detecting terminals may include a processor 802, a random access memory (RAM) 804, a read-only memory (ROM) 806, a storage 808, a display 810, an input/output interface 812, a database 814; and a communication interface 816. Other components may be added and certain devices may be removed without departing from the principles of the disclosed embodiments.

Processor 802 may include any appropriate type of general purpose microprocessor, digital signal processor or microcontroller, and application specific integrated circuit (ASIC). Processor 802 may execute sequences of computer program instructions to perform various processes associated with current-detecting terminals. Computer program instructions may be loaded into RAM 804 for execution by processor 802 from read-only memory 806, or from storage 808. Storage 808 may include any appropriate type of as storage provided to store any type of information that processor 802 may need to perform the processes. For example, storage 808 may include one or more hard disk devices, optical disk devices, flash disks, or other storage devices to provide storage space.

Display 810 may provide information to a user or users. Display 810 may include any appropriate type of computer display device or electronic device display (e.g., CRT or LCD based devices). Input/output interface 812 may be provided for users to input information into current-detecting terminals or for the users to receive information from current-detecting terminals. For example, input/output interface 812 may include any appropriate input device, such as a keyboard, a mouse, an electronic tablet, voice communication devices, touch screens, or any other optical or wireless input devices. Further, input/output interface 812 may receive from and/or send to other external devices.

Further, database 814 may include any type of commercial or customized database, and may also include analysis tools for analyzing the information in the databases. Database 814 may be used for storing information for fingerprint recognition and other related information. Communication interface 816 may provide communication connections such that current-detecting terminals may be accessed remotely and/or communicate with other systems through computer networks or other communication networks via various communication protocols, such as transmission control protocol/internet protocol (TCP/IP), hyper text transfer protocol (HTTP), etc.

In one embodiment, a user may touch or approach the OLED display substrate and the current-detecting terminals may receive signals generated by the image recognition units or the OLED units. The processor 802 may receive, process, and execute the signals to obtain the fingerprint pattern based on the related information stored in the database 814, ROM 806, and storm 808. After the data is processed, result of the pattern recognition can be obtained. The result can be returned to the user via the display 810 or the input/output interface 812. The semiconductor device may also respond accordingly to the touch motion.

The semiconductor device according to the embodiments of the present disclosure can be used in any product with display functions such as a television, an OLED display panel, a monitor, a laptop computer, an electronic paper, a digital photo frame, a mobile phone, a navigation device, and a tablet computer.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. An organic light-emitting diode (OLED) display substrate, comprising: a substrate and a plurality of organic light-emitting diode units, wherein an organic light-emitting diode unit comprises:
   a first layer comprising an anode and a first electrode apart from the anode;
   an organic light-emitting layer;
   a cathode; and
   a second electrode insulated from the cathode,
   wherein:
      the organic light-emitting layer is between the first electrode and the second electrode,
      the anode and the cathode are configured to drive the organic light-emitting layer to emit light; and
      the first electrode and the second electrode are configured to recognize touch patterns.

2. The OLED display substrate according to claim 1, further comprising: a current-detecting terminal, wherein:
   the first electrode is connected to the current-detecting terminal.

3. The OLED display substrate according to claim 2, wherein the first electrode layer and the second electrode are configured to form a photodiode; and
   the anode, the organic light-emitting layer, and the cathode are configured to form a pixel unit.

4. The OLED display substrate according to claim 2, wherein the organic light-emitting unit further comprises an insulating layer, the insulating layer being between the second electrode and the cathode.

5. The OLED display substrate according to claim 4, further comprising:
   a plurality of readout lines, a plurality of control lines, and a plurality of reading transistors, wherein:
   a reading transistor comprises a gate electrode;
   the readout lines are aligned along a first direction, a readout line being connected to a current-detecting terminal;
   the first electrodes of the plurality of organic light-emitting diode units are aligned along the first direction, a first electrode being connected to a readout line through a reading transistor; and
   the control lines are aligned along a second direction perpendicular to the first direction, a control line being connected to gate electrodes of reading transistors along the second direction.

6. The OLED display substrate according to claim 5, wherein:
   a readout line is configured to transmit signals from a photodiode connected to the readout line through a current-detecting terminal; and
   a control line is configured to control states of connected reading transistors.

7. The OLED display substrate according to claim 6, wherein a control line is configured to connect pixel unit aligned along the second direction for controlling scanning of pixel units and photodiodes in a same row.

8. The OLED display substrate according to claim 7, wherein a pixel unit comprises a plurality of pixel transistors, the pixel transistors and the reading transistors being of a same type.

9. A semiconductor device, comprising the OLED display substrate according to claim 1.

10. An operating method for recognizing a light-reflecting surface structure using the OLED display substrate according to claim 1, comprising:
   displaying an image in the plurality of organic light-emitting units;
   detecting an electric current generated in an organic light-emitting diode unit;
   determining whether there is light reflected by the light-reflecting surface structure in each organic light-emitting diode unit; and
   determining a touch pattern of the light-reflecting surface structures.

11. The operating method according to claim 10, wherein the detecting the electric current generated in an organic light-emitting diode unit further comprises:
   comparing electric currents generated by photodiodes in adjacent organic light-emitting diode units and determining whether an electric current is associated with light reflected by the light-reflecting surface structure; and
   determining organic light-emitting diode units corresponding to different parts of the touch pattern of the light-reflecting surface structure.

12. An organic light-emitting diode (OLED) display substrate, comprising: a substrate and a plurality of organic light-emitting diode units, wherein an organic light-emitting diode unit comprises:
   a first layer comprising an anode and a first electrode apart from the anode;
   an organic light-emitting layer;
   a cathode; and
   a second electrode insulated from the cathode,
   wherein:
      the anode, the organic light-emitting layer, and the cathode are configured to form a pixel unit, and the anode and the cathode are configured to drive the organic light-emitting layer to emit light; and the first electrode and the second electrode are configured to form a photodiode and to recognize touch patterns.

* * * * *